United States Patent
Park et al.

(10) Patent No.: US 10,522,060 B2
(45) Date of Patent: Dec. 31, 2019

(54) COVER WINDOW AND DISPLAY DEVICE USING THE SAME

(71) Applicant: LG Display Co., Ltd., Seoul (KR)

(72) Inventors: Young-Joo Park, Busan (KR); Se-Jin Jang, Paju-si (KR); Yu-Lim Won, Incheon (KR); Suk Choi, Hwaseong-si (KR)

(73) Assignee: LG Display Co., Ltd., Seoul (KR)

( * ) Notice: Subject to any disclaimer, the term of this patent is extended or adjusted under 35 U.S.C. 154(b) by 84 days.

(21) Appl. No.: 15/720,996

(22) Filed: Sep. 29, 2017

(65) Prior Publication Data
US 2018/0096635 A1    Apr. 5, 2018

(30) Foreign Application Priority Data
Sep. 30, 2016    (KR) .................. 10-2016-0126722

(51) Int. Cl.
| | |
|---|---|
| *G09F 9/30* | (2006.01) |
| *H01L 51/52* | (2006.01) |
| *H05K 1/02* | (2006.01) |
| *H01L 51/00* | (2006.01) |
| *G09F 9/33* | (2006.01) |

(52) U.S. Cl.
CPC ............ *G09F 9/301* (2013.01); *G09F 9/33* (2013.01); *H01L 51/0097* (2013.01); *H01L 51/5253* (2013.01); *H05K 1/028* (2013.01); *H01L 2251/5338* (2013.01); *Y02E 10/549* (2013.01)

(58) Field of Classification Search
CPC .......... H01L 51/5253; H01L 51/0097; G06F 1/1652; G06F 2203/04102; G06F 3/0414; G06F 1/1616; G09G 2380/02; H05K 1/028; H05K 1/0281; H05K 2201/055
See application file for complete search history.

(56) References Cited

U.S. PATENT DOCUMENTS

| | | | |
|---|---|---|---|
| 2011/0234529 A1* | 9/2011 | Lee ..................... | G06F 3/044 345/174 |
| 2015/0043174 A1* | 2/2015 | Han .................... | G02F 1/13452 361/749 |

(Continued)

FOREIGN PATENT DOCUMENTS

| | | |
|---|---|---|
| CN | 103578356 A | 2/2014 |
| CN | 104347000 A | 2/2015 |

(Continued)

OTHER PUBLICATIONS

Office Action dated May 30, 2019 issued in the corresponding Chinese Patent Application No. 201710920029.5 (19 pages).

*Primary Examiner* — Sanjiv D. Patel
(74) *Attorney, Agent, or Firm* — Polsinelli PC (57) ABSTRACT

Disclosed are a cover window in which both a folding area and a non-folding area are formed using the same kind of material, thereby matching the indices of refraction thereof with each other, having the same heat resistance, and ensuring easy surface hard coating thereof, and a display device using the same. The cover window, having at least one folding area and a non-folding area, includes a hard portion located to correspond to the non-folding area, a soft portion located to correspond to the folding area, the soft portion being flexible, and a hard coating layer configured to cover the hard portion and the soft portion.

20 Claims, 5 Drawing Sheets

(56) References Cited

U.S. PATENT DOCUMENTS

| | | | |
|---|---|---|---|
| 2015/0049428 A1* | 2/2015 | Lee | G06F 1/1652 361/679.27 |
| 2015/0147532 A1* | 5/2015 | Nam | G02B 26/005 428/172 |
| 2016/0185915 A1* | 6/2016 | Kim | C08G 77/24 428/447 |
| 2016/0271914 A1 | 9/2016 | Xie | |
| 2017/0131591 A1* | 5/2017 | Rantala | C08L 83/06 |

FOREIGN PATENT DOCUMENTS

| | | |
|---|---|---|
| CN | 204331666 U | 5/2015 |
| CN | 104680941 A | 6/2015 |
| CN | 207637432 U | 7/2018 |

\* cited by examiner

COVER WINDOW AND DISPLAY DEVICE USING THE SAME

CROSS-REFERENCE TO RELATED APPLICATION

This application claims the benefit of Korean Patent Application No. 10-2016-0126722, filed on Sep. 30, 2016, which is hereby incorporated by reference in its entirety as if fully set forth herein.

BACKGROUND

Field of the Disclosure

The present disclosure relates to a display device, and more particularly, to a cover window and a display device using the same. Although the present disclosure is suitable for a wide scope of applications, it is particularly suitable for increasing resistance to external impact of a display device by providing a cover window, which includes a non-folding area having high rigidity and a folding area having flexibility.

Description of the Background

An image display device, which realizes various pieces of information on a screen, is a core technology of the information and communication age, and has been developed in the direction of becoming thinner, lighter, more portable, and having higher performance. As a flat panel display device that is capable of overcoming the problems of disadvantageous weight and volume of a cathode ray tube (CRT), for example, an organic light-emitting display device, which displays an image by controlling the intensity of luminescence of an organic emission layer, is attracting attention.

Such an organic light-emitting display device displays an image using a plurality of pixels, which are arranged in a matrix form. Here, each pixel includes a light-emitting element and a pixel drive circuit having multiple transistors that implement independent driving of the light-emitting element.

Since the organic light-emitting display device described above uses a self-illuminating organic light-emitting element, and therefore does not require a separate light source and enables realization of a super-thin-type display device, in recent years, research on a foldable display device having an in-cell touch structure has actively been conducted, which uses an organic light-emitting element and includes a touch electrode array inside a light-emitting cell.

The foldable display device is configured such that the display device itself including a display panel is configured so as to be folded, and thus a foldable cover window is implemented. The foldable cover window is manufactured using a plastic film, instead of a conventional glass substrate. The cover window using the plastic film, however, has lower impact resistance than a conventional glass cover window.

SUMMARY

Accordingly, the present disclosure is directed to a cover window and a display device using the same that substantially obviate one or more problems due to limitations and disadvantages of the prior art.

The present disclosure is to provide a cover window, which includes a non-folding area having high rigidity and a folding area having flexibility and may increase impact resistance of both the folding area and the non-folding area, and a display device using the same.

Additional advantages and features of the disclosure will be set forth in part in the description which follows and in part will become apparent to those having ordinary skill in the art upon examination of the following or may be learned from practice of the disclosure. Other advantages of the disclosure may be realized and attained by the structure particularly pointed out in the written description and claims hereof as well as the appended drawings.

To achieve these and other advantages and in accordance with the purpose of the disclosure, as embodied and broadly described herein, a cover window, having at least one folding area and a remaining non-folding area, includes a hard portion located to correspond to the non-folding area, a soft portion located to correspond to the folding area, the soft portion being flexible, and a hard coating layer configured to cover the hard portion and the soft portion.

The soft portion may include a first silicone resin, and the hard portion and the hard coating layer may include a mixture of a second silicone resin and a third silicone resin, which have a hardness higher than that of the silicone resin.

The soft portion may be integrally formed in an entire area including the folding area and the non-folding area, and the hard portion and the hard coating layer may be formed by applying a mixture of the second silicone resin, the third silicone resin, an ultraviolet curing initiator and a thermosetting initiator, onto the soft portion, and then sequentially performing ultraviolet curing and thermosetting.

According to another aspect of the present disclosure, a display device having a cover window comprises a display panel having at least one folding area in a display area; a cover window on the display panel and having at least one folding area and at least one non-folding area; a hard portion disposed to correspond to the at least one non-folding area; a soft portion disposed to correspond to the folding area, the soft portion being flexible; and a hard coating layer covering the hard portion and the soft portion.

In a further aspect of the present disclosure, a cover window for a foldable display device having non-folding areas and a folding area between the non-folding areas comprises a hard portion disposed to correspond to the non-folding area; a soft portion having flexibility and disposed to correspond to the folding area, wherein the hard portion and the soft portion have a difference in indices of refraction small enough to prevent visibility at proximity of a boundary between the hard portion and the soft portion; and a hard coating layer covering the hard portion and the soft portion.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the present disclosure and are incorporated in and constitute a part of this disclosure, illustrate aspect(s) of the disclosure and together with the description serve to explain the principle of the disclosure. In the drawings.

DETAILED DESCRIPTION

Hereinafter, exemplary aspects of the present disclosure will be described with reference to the accompanying drawings. Wherever possible, the same reference numbers will be used throughout the drawings to refer to the same or like parts. In addition, in the following description of the aspects, a detailed description of known functions and configurations incorporated herein will be omitted when it may make the subject matter of the present disclosure rather unclear. Also, the terms of constituent elements used in the following description are defined taking into consideration ease in the preparation of the specification, and may differ from the terms used to describe elements of actual products.

It will be understood that, when an element or a layer is referred to as being "on" or "above" another element, it can be directly on the other element, or intervening elements may also be present. On the other hand, when an element or a layer is referred to as being "in contact with" another element, no element or layer is interposed therebetween.

In the drawings, the size and thickness of each constituent element are illustrated merely for convenience of description, and the present disclosure is not necessarily limited to the illustrated size and thickness of each constituent element.

Figure 1:
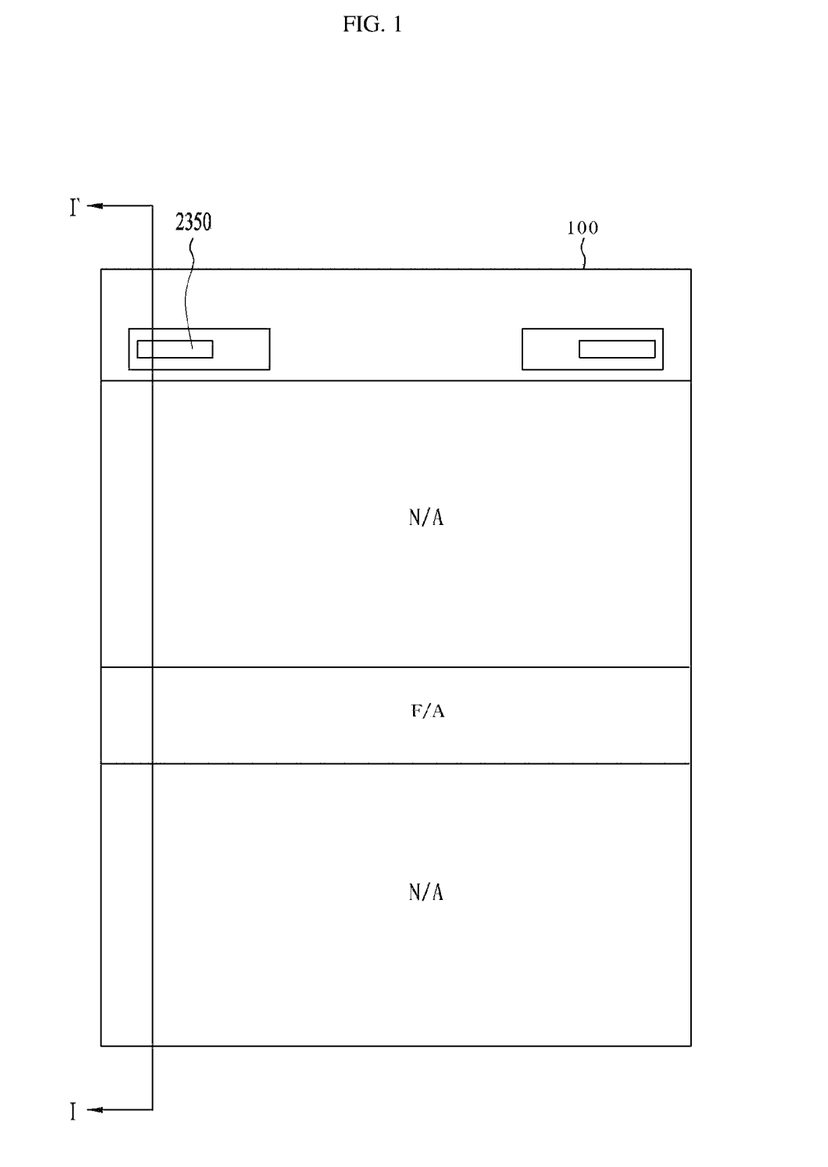
FIG. 1 is a view for explaining a foldable display device according to an aspect of the present disclosure.
Figure 2:
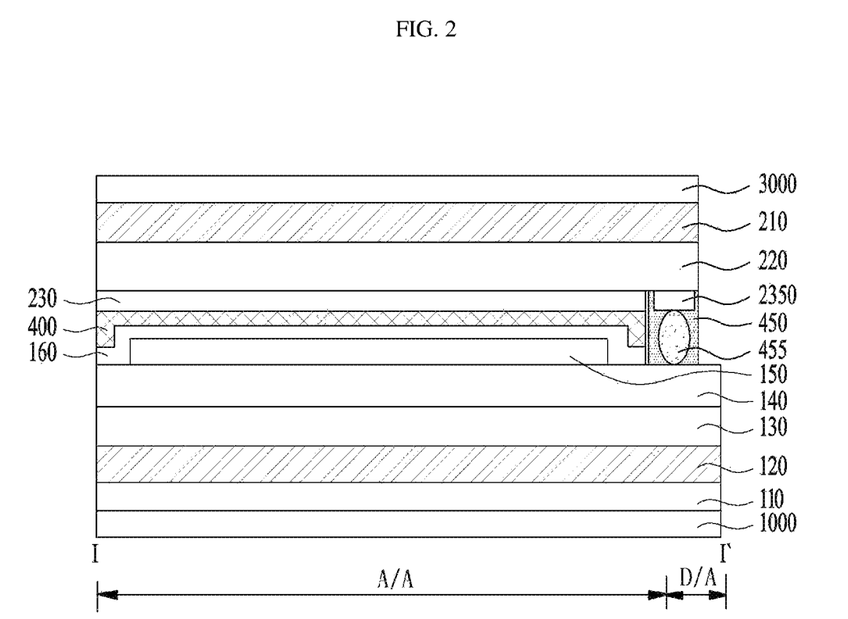
FIG. 2 is a cross-sectional view taken along line I-I' of FIG. 1.

FIG. 1 is a view for explaining a foldable display device according to an aspect of the present disclosure, and FIG. 2 is a cross-sectional view taken along line I-I' of FIG. 1.

The foldable display device according to an aspect of the present disclosure includes a display panel 100, which includes at least one folding area F/A in a display area thereof, and a cover window 3000, which covers the entire surface of the display panel 100.

Explaining this in more detail with reference to the cross-sectional view of FIG. 2, the foldable display device according to an aspect of the present disclosure includes a back frame 1000, a first base 120 bonded on the back frame 1000 via a first adhesive layer 110, a first buffer layer 130 disposed on the first base 120, a thin-film transistor array 140 on the first buffer layer 130, an organic light-emitting array 150 on the thin-film transistor array 140, a protective layer 160, which covers the thin-film transistor array 140, excluding a pad portion thereof, and the organic light-emitting array 150, a touch electrode array 230 attached to the protective layer 160 with an adhesive layer 400 interposed therebetween, a second buffer layer 220 and a second base 210 sequentially formed on the touch electrode array 230, and the cover window 3000 disposed on the upper side of the second base 210.

The thin-film transistor array 140 has a plurality of pixels defined in a matrix form. A plurality of thin-film transistors are provided for the respective pixels. The organic light-emitting array 150 has a plurality of organic light-emitting diodes connected to the thin-film transistor of each pixel.

The back frame 1000 may be formed of, for example, metal or plastic, and may include at least one folding area.

In each of the first buffer layer 130 and the second buffer layer 220, an active area and a dead area are defined. The touch electrode array 230, the organic light-emitting array 150, and the thin-film transistors in the thin-film transistor array 140 excluding the pad portion are formed in the active area. In addition, a touch pad portion 2350 and the pad portion of the thin-film transistor array 140 are defined in a portion of the dead area.

Here, the first and second bases 120 and 210 serve to prevent damage to the arrays therebetween during laser irradiation or etching, and in some cases, serve to protect the display device from external impacts. The first and second bases 120 and 210 may be formed of a polymer material such as, for example, polyimide and photoacryl.

Each of the first buffer layer 130 and the second buffer layer 220 is formed by sequentially stacking the same kind of inorganic layers such as $SiO_2$ and $SiN_x$ one above another, or by alternately stacking different inorganic layers one above another. The first and second buffer layers 130 and 210 function as a barrier that prevents moisture or outside air from permeating the organic light-emitting array 150 in the subsequent process of bonding the cover window 3000 to the back frame 1000.

The touch electrode array 230 and the touch pad portion 2350 are formed on the same surface of the second buffer layer 220. The touch pad portion 2350 is connected to the pad portion (not illustrated) of the thin-film transistor array 140 by a seal 450 having a conductive ball 455, in a vertical bonding process using the adhesive layer 400. At this time, the adhesive layer 400 has a moisture permeation preventing function and is directly in contact with the protective layer 160, which covers the organic light-emitting array 150, thereby serving to prevent outside air from entering the organic light-emitting array 150 and to more reliably prevent the permeation of moisture, in addition to the function of the protective layer 160.

Here, the thin-film transistor array 140 including the pad portion may be configured so as to protrude from one side of the touch electrode array 230, and a driving integrated circuit (IC) may be provided on the protruding portion of the thin-film transistor array 140 to transmit signals for driving the touch electrode array 230, the thin-film transistor array 140, and the organic light-emitting array 150. Although not illustrated, with regard to the driving IC and the thin-film transistor array 140, a driving pad and a dummy pad may include a plurality of dummy electrodes and are connected to the driving IC via wires. In addition, after glass removal, the driving IC may be bonded to and connected to a flexible printed circuit board (FPCB) (not illustrated), thereby being controlled by a micro control unit (MCU) (not illustrated) and a timing controller (not illustrated) provided in the FPCB. The dummy pad is formed with the same layer as the metal that forms a gate line or a data line in the area that corresponds to the touch pad portion 2350 in the dead area around the active area.

The driving IC may be mounted on the flexible printed circuit board or an anisotropic conductive film (ACF) in a chip-on-film (COF) manner.

Although not illustrated, the dummy pad and the driving pad of the thin-film transistor array 140 are connected to the flexible printed circuit board via wires (not illustrated). In addition, the flexible printed circuit board may further include the controller (not illustrated) for controlling the driving IC.

The dummy pad is formed with the same layer as the metal that forms a gate line or a data line in the area that corresponds to the touch pad portion 2350 in the dead area around the active area.

Figure 3:
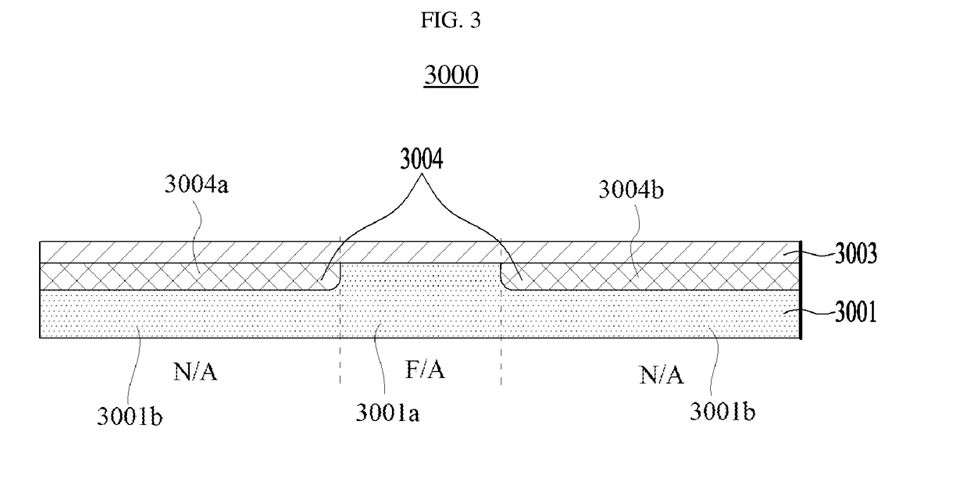
FIG. 3 is a schematic view for explaining a cover window according to the present disclosure.

FIG. 3 is a schematic view for explaining the cover window 3000 according to the present disclosure in detail.

The cover window 3000 according to the present disclosure includes at least one folding area and a remaining non-folding area. A soft portion 3001 is located to correspond to the folding area F/A of the cover window 3000. In addition, a hard portion 3004 is located in the non-folding area. Here, the hard portion 3004 has a feature of relatively high rigidity, and the soft portion 3001 has a feature of relatively low rigidity and flexibility.

Here, the soft portion 3001 may be formed in the entire surface of the cover window 3000, which includes the folding area F/A and the non-folding area N/A. Here, the thickness of a soft portion 3001*a* in the folding area F/A is greater than the thickness of a soft portion 3001*b* in the non-folding area N/A. Explaining this in more detail, the soft portion 3001*a* in the folding area F/A protrudes upward from the soft portion 3001*b* in the non-folding area N/A, whereby the height of the soft portion 3001*a* in the folding area F/A is greater than the height of the soft portion 3001*b* in the non-folding area N/A.

When the soft portion 3001 is formed in the entire surface of the cover window 3000, hard portions 3004*a* and 3004*b* are located on the soft portion 3001*b* in the non-folding area N/A. Here, the hard portions 3004*a* and 3004*b* are shaped to fill stepped regions, which are formed between the soft portion 3001*b* in the non-folding area N/A and the soft portion 3001*a* in the folding area F/A. Thereby, the sum of the heights of the soft portion 3001*b* and the hard portions 3004*a* and 3004*b* in the non-folding area N/A is the same as the height of the soft portion 3001*a* in the folding area F/A.

A hard coating layer 3003 is disposed on the hard portions 3004*a* and 3004*b* and the soft portion 3001*a* in the folding area F/A so as to be in contact with the same. The hard coating layer 3003 serves to directly protect the display device from external impacts, and therefore is formed to have high hardness. Thereby, the hard portions 3004*a* and 3004*b* are provided between the soft portions 3001*a* and 3001*b* and the hard coating layer 3003.

In the cover window 3000 of the foldable display device according to the present disclosure, the hard portions 3004*a* and 3004*b* may be formed of a material that has high rigidity, the soft portions 3001*a* and 3001*b* may be formed of a material that has relatively low rigidity and is foldable, and the hard coating layer 3003 may be formed of a material that has high hardness. In other words, the soft portions 3001*a* and 3001*b*, the hard portions 3004*a* and 3004*b*, and the hard coating layer 3003 may be formed of different materials, respectively.

However, the cover window 3000 of the foldable display device undergoes bending due to thermal expansion during processing because it is formed of different kinds of materials having different heat resistance characteristics, and entails the possibility of making the boundary between the different kinds of materials visible because the different kinds of materials have different indices of refraction. In addition, when the soft portions 3001*a* and 3001*b* and the hard portions 3004*a* and 3004*b* are formed of different kinds of materials, the soft portions 3001*a* and 3001*b* and the hard portions 3004*a* and 3004*b* have different adhesive forces according to the characteristics of the different kinds of materials, and the hard coating layer 3003 has difficulty in being uniformly attached to the differently kinds of materials.

In order to solve this problem, all of the soft portion 3001, the hard portion 3004 and the hard coating layer 3003 may be formed of compounds based on the same kind of material, for example, a silicone resin. Explaining this in more detail, the soft portion 3001 is formed of a first silicone resin having flexibility, and the hard portion 3004 and the hard coating layer 3003 include a mixture of a second silicone resin and a third silicone resin, which have rigidity and hardness higher than those of the first silicone resin, and are formed by curing the same. Here, since the soft portion 3001 and the hard portion 3004 are formed of compounds based on the same kind of material, the difference between the indices of refraction of the soft portion 3001 and the hard portion 3004 can be adjusted to be within 0.01. In other words, among various silicone resins, the first to third silicone resins are selected from among materials that have a difference in the indices of refraction within 0.01 upon curing.

This will be described below in more detail.

The first silicone resin that constitutes the soft portion 3001 may include a compound selected from among siloxane-based compounds. The soft portion 3001 is formed to attain flexibility by curing a material that includes a siloxane-based first silicone resin and a thermosetting initiator.

Here, the soft portion 3001 may be integrally formed via injection molding. Examples of the thermosetting initiator may include one of peroxide tin salts, titanium alkoxides, PT or RH, without being necessarily limited thereto.

As described above, the hard portion 3004 and the hard coating layer 3003 respectively include a mixture of the second silicone resin and the third silicone resin.

Here, the second silicone resin may be based on a material in which at least one of an acryl side chain or an aliphatic side chain is coupled to a polysiloxane-based backbone, without being necessarily limited thereto. In addition, the third silicone resin may be based on a material in which a phenyl side chain is coupled to a siloxane-based backbone, without being necessarily limited thereto.

The hard portion 3004 and the hard coating layer 3003 are formed by sequentially ultraviolet curing and thermosetting a mixture that includes the second and third silicone resins described above, a thermosetting initiator, and an ultraviolet curing initiator. Here, in order to form the hard portion 3004 and the hard coating layer 3003, for example, the time taken for ultraviolet curing and thermosetting and the hardness thereof may be adjusted so that the phase separation of the mixture can occur.

The method of forming the hard portion 3004 and the hard coating layer 3003 described above will be described below in more detail with reference to FIGS. 4A to 4C.

Figure 4A:
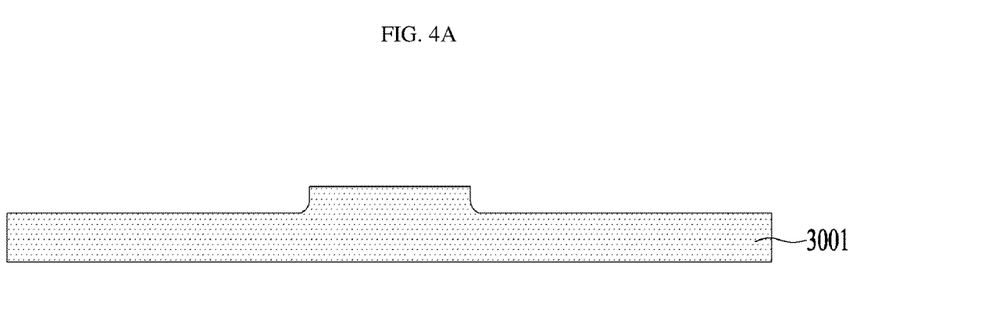
FIGS. 4A to 4C are a schematic view for explaining a method of forming the cover window according to the present disclosure.

As shown in FIG. 4A, the soft portion 3001 is formed through an injection molding process. The formation of the soft portion 3001 has been described above in detail, and thus a detailed description thereof will be omitted.

Figure 4B:
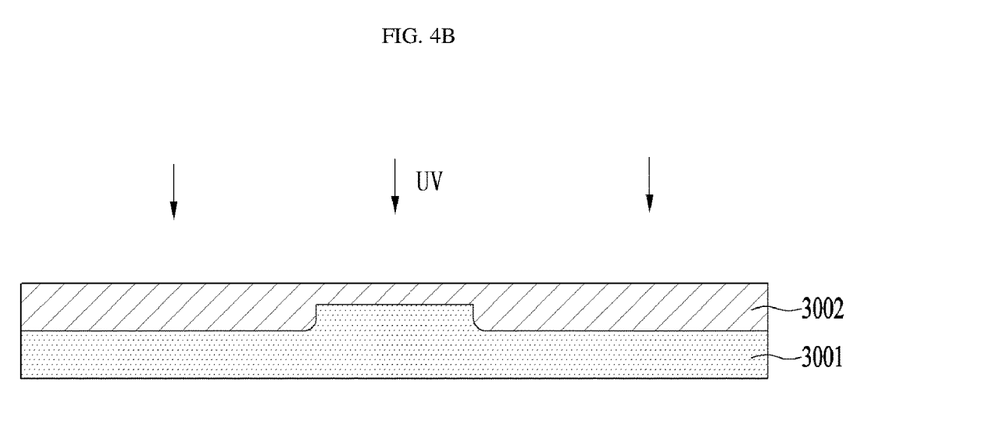
Figure 4C:
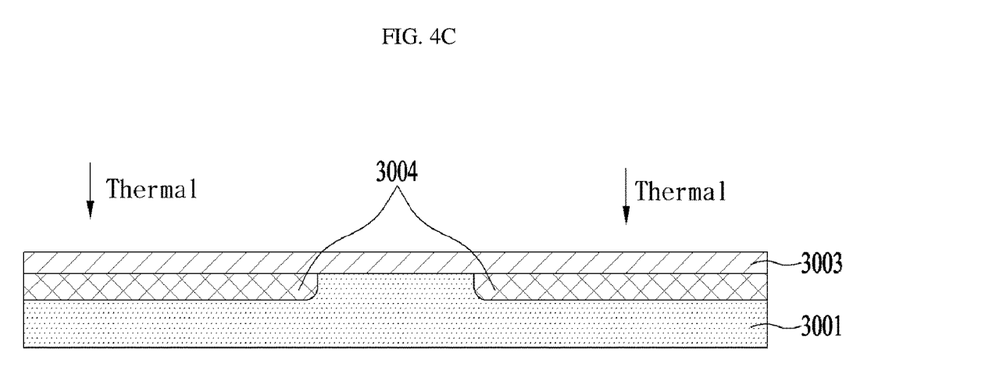

As shown in FIG. 4B, a mixture 3002, which includes second and third silicone resins, a thermosetting initiator, and an ultraviolet curing initiator, is applied onto the soft portion 3001.

Subsequently, the outer surface of the mixture 3002 is subjected to ultraviolet curing by irradiating the mixture 3002 with ultraviolet light. As shown in FIG. 4C, as curing occurs in the acryl side chain or aliphatic side chain portion of the second silicone resin, the hard coating layer 3003 having high hardness is first formed. At this time, the area to be formed into the hard portion 3004, i.e. the mixture 3002 located on the soft portion 3001 in the non-folding area N/A is not cured.

Subsequently, a thermosetting process is performed. Thereby, curing occurs via reaction of the third silicone resin and the thermosetting agent, among the mixture located on the soft portion 3001 in the non-folding area N/A, whereby the hard portion 3004 having high rigidity is formed.

Here, the thermosetting initiator may be the same material as that is used to form the soft portion 3001. Meanwhile, examples of the material that may be used as the ultraviolet curing initiator may include one of DPMA, PEGDA, acryloyl chloride, benzyl ketal-based materials, α-hydroxy alkylphenone-based materials, thioxanthine derivatives, acrylphosphineoxide-based materials, benzoin-based materials, sulfonium derivatives, or iodine-based materials, without being necessarily limited thereto.

Figure 5:
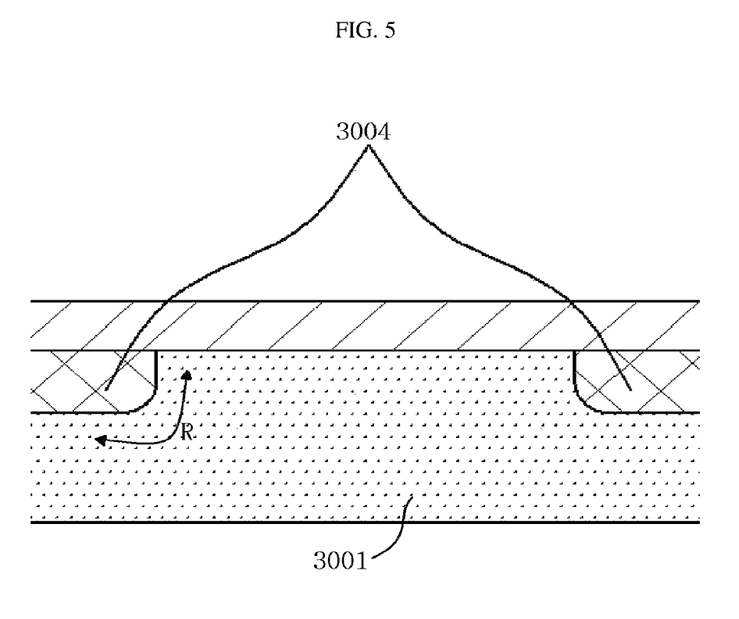
FIG. 5 is an enlarged schematic view of an interface between a soft portion and a hard portion of the cover window according to the present disclosure.

FIG. 5 is an enlarged schematic view of an interface between the soft portion 3001 and the hard portion 3004.

When the corner of the hard portion 3004 that is in contact with the soft portion 3001a in the folding area F/A is formed to have a curvature, this is advantageous in preventing the boundary between the soft portion 3001a and the hard portion 3004 from being visible. A radius of curvature may be approximately half the thickness of the hard portion 3004 in preventing visibility, without being necessarily limited thereto, and various modifications are possible depending on the design.

When the entire cover window 3000 of the present disclosure described above is formed of the same kind of material, for example, a silicone-based resin, the hard portion 3004 and the soft portion 3001 may have almost the same index of refraction, and therefore the boundary between the folding area F/A and the non-folding area N/A is not visible.

In addition, the soft portion 3001, the hard portion 3004, and the hard coating layer 3003 have almost identical thermal characteristics, and thus almost no difference in thermal hysteresis occurs. Thereby, since all of these portions have the same heat resistance at a given processing temperature, bending due to thermal expansion may be prevented. In addition, the soft portion 3001 of the cover window 3000 according to the present disclosure has excellent flexibility, thereby preventing, for example, cracks, even if it is folded to a high curvature of 1R or more.

In addition, the cover window 3000 according to the present disclosure may realize free folding of the soft portion 3001, may be thickly formed, and may achieve increased impact resistance due to its increased thickness, owing to the three-layered structure of the soft portion 3001, the hard portion 3004, and the hard coating layer 3003.

In addition, the manufacture of the cover window 3000 according to the present disclosure may be simplified and manufacturing costs may be reduced because the hard portion 3004 and the hard coating layer 3003 may be formed using the same mixture.

As is apparent from the above description, a cover window according to the present disclosure may achieve a thickness having sufficient impact resistance owing to provision of three layers constituting a soft portion, a hard portion, and a hard coating layer, and may also entail excellent folding characteristics in the soft portion. Thereby, the soft portion of the cover window according to the present disclosure does not exhibit, for example, cracks, even if it is folded to a high curvature.

Meanwhile, the entire cover window according to the present disclosure may be formed of the same kind of resin, for example, a silicone resin. In this case, the soft portion and the hard portion have almost the same index of refraction. Accordingly, in the cover window, which is formed of the same kind of resin, the boundary between a folding area and a non-folding area is not visible.

In addition, when the cover window according to the present disclosure is formed of the same kind of resin, since the hard portion, the soft portion, and the hard coating layer have almost identical thermal characteristics, all of these portions have the same heat resistance at a given processing temperature, and thus thermal expansion and bending do not occur.

In addition, when the cover window according to the present disclosure is formed of the same kind of resin, the process is simplified and manufacturing costs are reduced.

Although the aspects of the present disclosure have been described above in detail with reference to the accompanying drawings, it will be apparent to those skilled in the art that the present disclosure described above is not limited to the aspects described above, and various substitutions, modifications, and alterations may be devised within the spirit and scope of the present disclosure. Accordingly, various aspects disclosed in the present disclosure are not intended to limit the technical sprit of the present disclosure, and the scope of the technical sprit of the present disclosure is not limited by the aspects. Accordingly, the disclosed aspects are provided for the purpose of description and are not intended to limit the technical scope of the disclosure, and the technical scope of the disclosure is not limited by the aspects. The range of the disclosure should be interpreted based on the following claims, and all technical ideas that fall within the range equivalent to the claims should be understood as belonging to the scope of the disclosure.

What is claimed is:

1. A cover window having at least one folding area and at least one non-folding area, comprising:
    a soft portion being flexible and disposed to correspond to the at least one folding area and the non-folding area, wherein the soft portion corresponding to the at least one folding area has a height greater than that of the soft portion corresponding to the at least one non-folding area in an unfolded state;
    a hard portion disposed on only a portion of the soft portion which corresponds to the at least one non-folding area; and
    a hard coating layer configured to cover the hard portion and the soft portion,
    wherein the hard coating layer directly contacts the soft portion corresponding to the at least one folding area, and
    wherein the hard portion, the soft portion and the hard coating layer have substantially the same thermal characteristic that prevents the cover window from thermal expansion and bending.

2. The cover window according to claim 1, wherein the soft portion is disposed to correspond to both the folding area and the non-folding area, and the soft portion corresponding to the non-folding area has a height lower than a height of the soft portion corresponding to the folding area.

3. The cover window according to claim 2, wherein the hard portion is disposed between the soft portion and the hard coating layer, and a sum of heights of the soft portion and the hard portion, corresponding to the non-folding area, is the same as the height of the soft portion corresponding to the folding area.

4. The cover window according to claim 1, wherein the soft portion, the hard portion and the hard coating layer are formed of the same kind of resin.

5. The cover window according to claim 4, wherein the soft portion, the hard portion and the hard coating layer include a silicone-based resin.

6. The cover window according to claim 5, wherein the soft portion includes a first silicone resin having a siloxane base.

7. The cover window according to claim 6, wherein the soft portion includes the first silicone resin and a thermosetting initiator.

8. The cover window according to claim 5, wherein the hard portion and the hard coating layer include a mixture of a second silicone resin and a third silicone resin, which have a hardness greater than that of the silicone resin of the soft portion.

9. The cover window according to claim 8, wherein the second silicone resin includes a silicone resin based on a material in which at least one of an acryl side chain or an aliphatic side chain is coupled to a polysiloxane-based backbone.

10. The cover window according to claim 8, wherein the third silicone resin includes a silicone resin based on a material in which a phenyl side chain is coupled to a siloxane-based backbone.

11. A method of manufacturing a cover window having a folding area and a non-folding area, comprising:
forming a soft portion having flexibility to dispose to correspond to the folding area and the non-folding area;
applying a mixture of a second silicone resin and a third silicone resin on the soft portion;
adding an ultraviolet curing initiator and a thermosetting initiator to the mixture;
curing the applied mixture with the added initiators by irradiating ultraviolet light to form a hard portion corresponding to the non-folding area; and
forming a hard coating layer to cover the hard portion and the soft portion,
wherein the soft portion corresponding to the folding area has a height greater than that of the soft portion corresponding to the non-folding area in an unfolded state,
wherein the hard portion is disposed on only a portion of the soft portion which corresponds to the at least one non-folding area;
wherein the hard coating layer directly contacts the soft portion corresponding to the at least one folding area, and
wherein the hard portion, the soft portion and the hard coating layer have substantially the same thermal characteristic that prevents the cover window from thermal expansion and bending.

12. The cover window according to claim 11, further comprising thermosetting an area corresponding to the hard portion after the forming the hard coating layer.

13. The cover window according to claim 1, wherein the hard portion has a portion in contact with the soft portion in the folding area, and the contact portion has a curvature.

14. The cover window according to claim 1, wherein the hard portion and the soft portion have a difference in indices of refraction within 0.01.

15. A display device having a cover window, comprising:
a display panel having at least one folding area in a display area; a cover window on the display panel and having at least one folding area and at least one non-folding area;
a soft portion having flexibility and disposed to correspond to the folding area, wherein the soft portion corresponding to the folding area has a height greater than that of the soft portion corresponding to the non-folding area in an unfolded state;
a hard portion disposed on only a portion of the soft portion which corresponds to the at least one non-folding area; and
a hard coating layer covering the hard portion and the soft portion,
wherein the hard coating layer directly contacts the soft portion corresponding to the at least one folding area, and
wherein the hard portion, the soft portion and the hard coating layer have substantially the same thermal characteristic that prevents the cover window from thermal expansion and bending.

16. A cover window for a foldable display device having non-folding areas and a folding area between the non-folding areas, comprising:
a hard portion disposed to correspond to the non-folding area;
a soft portion having flexibility and disposed to correspond to the folding area, wherein the hard portion and the soft portion have a difference in indices of refraction small enough to prevent visibility at proximity of a boundary between the hard portion and the soft portion, and
wherein the soft portion corresponding to the folding area has a height greater than that of the soft portion corresponding to the non-folding areas in an unfolded state; and
a hard coating layer covering the hard portion and the soft portion,
wherein the hard coating layer directly contacts the soft portion corresponding to the at least one folding area, and
wherein the hard portion, the soft portion and the hard coating layer have substantially the same thermal characteristic that prevents the cover window from thermal expansion and bending.

17. The cover window according to claim 16, wherein the difference in indices of refraction is equal to or less than 0.01.

18. The cover window according to claim 16, wherein the hard portion has a contact portion with the soft portion in the folding area, and the contact portion has a curvature.

19. The cover window according to claim 18, wherein the curvature has a radius of approximately half a thickness of the hard portion.

20. The cover window according to claim 16, wherein the hard portion is disposed between the soft portion and the hard coating layer, and a sum of heights of the soft portion and the hard portion, corresponding to the non-folding area, is the same as the height of the soft portion corresponding to the folding area.

* * * * *